US011289422B2

United States Patent
Yan et al.

(10) Patent No.: US 11,289,422 B2
(45) Date of Patent: Mar. 29, 2022

(54) BONDING ALIGNMENT MARKS AT BONDING IN INTERFACE

(71) Applicant: YANGTZE MEMORY TECHNOLOGIES CO., LTD., Wuhan (CN)

(72) Inventors: Meng Yan, Wuhan (CN); Jia Wen Wang, Wuhan (CN); Si Ping Hu, Wuhan (CN); Shun Hu, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 400 days.

(21) Appl. No.: 16/218,472

(22) Filed: Dec. 12, 2018

(65) Prior Publication Data
US 2020/0159133 A1 May 21, 2020

Related U.S. Application Data

(63) Continuation of application No. PCT/CN2018/116664, filed on Nov. 21, 2018.

(51) Int. Cl.
*H01L 23/528* (2006.01)
*H01L 23/544* (2006.01)
*H01L 25/065* (2006.01)
(Continued)

(52) U.S. Cl.
CPC ........ *H01L 23/5283* (2013.01); *G03F 9/7049* (2013.01); *G03F 9/7088* (2013.01);
(Continued)

(58) Field of Classification Search
CPC ........... H01L 27/11575; H01L 25/0657; H01L 24/08; H01L 24/80; H01L 23/5283;
(Continued)

(56) References Cited

U.S. PATENT DOCUMENTS 5,753,536 A * 5/1998 Sugiyama ............... H01L 24/12
438/108
6,965,166 B2 11/2005 Hikita et al.
(Continued)

FOREIGN PATENT DOCUMENTS

CN 1674282 A 9/2005
CN 101840886 A 9/2010
(Continued)

OTHER PUBLICATIONS

International Search Report issued in corresponding International Application No. PCT/CN2018/116664, dated Aug. 20, 2019, 4 pages.
(Continued)

*Primary Examiner* — Brigitte A Paterson
(74) *Attorney, Agent, or Firm* — Bayes PLLC

(57) ABSTRACT

Embodiments of bonded semiconductor structures and fabrication methods thereof are disclosed. In an example, a semiconductor device includes a first semiconductor structure, a second semiconductor structure, and a bonding interface between the first semiconductor structure and the second semiconductor structure. The first semiconductor structure includes a substrate, a first device layer disposed on the substrate, and a first bonding layer disposed above the first device layer and including a first bonding contact and a first bonding alignment mark. The second semiconductor structure includes a second device layer, and a second bonding layer disposed below the second device layer and including a second bonding contact and a second bonding alignment mark. The first bonding alignment mark is aligned with the second bonding alignment mark at the bonding interface, such that the first bonding contact is aligned with the second bonding contact at the bonding interface.

14 Claims, 9 Drawing Sheets

(51) Int. Cl.
  *H01L 23/00* (2006.01)
  *H01L 27/11575* (2017.01)
  *G03F 9/00* (2006.01)

(52) U.S. Cl.
  CPC .......... *G03F 9/7092* (2013.01); *H01L 23/544* (2013.01); *H01L 24/80* (2013.01); *H01L 25/0657* (2013.01); *H01L 27/11575* (2013.01); H01L 24/05 (2013.01); H01L 24/08 (2013.01); H01L 2223/54426 (2013.01); H01L 2224/04 (2013.01); H01L 2224/05624 (2013.01); H01L 2224/05647 (2013.01); H01L 2224/05657 (2013.01); H01L 2224/05684 (2013.01); H01L 2224/05686 (2013.01); H01L 2224/08121 (2013.01); H01L 2224/08145 (2013.01); H01L 2224/08146 (2013.01); H01L 2224/8013 (2013.01); H01L 2224/80132 (2013.01); H01L 2224/80895 (2013.01); H01L 2224/80896 (2013.01); H01L 2224/80905 (2013.01); H01L 2224/80908 (2013.01); H01L 2225/06524 (2013.01); H01L 2225/06544 (2013.01); H01L 2225/06565 (2013.01)

(58) Field of Classification Search
  CPC ......... H01L 23/544; H01L 2225/06524; H01L 2225/06544; H01L 2225/06565; H01L 2224/08146; H01L 2224/8013; H01L 2224/80905; H01L 2224/80908; H01L 2224/80895; H01L 2224/80896; H01L 2223/54426
  See application file for complete search history.

(56) References Cited

U.S. PATENT DOCUMENTS

| | | | |
|---|---|---|---|
| 10,157,867 B1 * | 12/2018 | Chen | ................... H01L 23/5226 |
| 2003/0146518 A1 | 8/2003 | Hikita et al. | |
| 2007/0216041 A1 * | 9/2007 | Patti | ...................... H01L 23/544 |
| | | | 257/797 |
| 2017/0084544 A1 | 3/2017 | Chen | |
| 2018/0261575 A1 * | 9/2018 | Tagami | ................... H01L 25/50 |
| 2019/0096830 A1 * | 3/2019 | Wei | ................... H01L 27/14607 |
| 2019/0164899 A1 * | 5/2019 | Hu | ...................... G03F 7/70475 |

FOREIGN PATENT DOCUMENTS

| | | |
|---|---|---|
| CN | 102263084 A | 11/2011 |
| CN | 102800654 A | 11/2012 |
| CN | 102812540 A | 12/2012 |
| CN | 106024756 A | 10/2016 |
| CN | 106549004 A | 3/2017 |
| CN | 104335337 B | 5/2017 |
| TW | 201732908 A | 9/2017 |
| TW | 201803018 A | 1/2018 |

OTHER PUBLICATIONS

Written Opinion of the International Searching Authority issued in corresponding International Application No. PCT/CN2018/116664, dated Aug. 20, 2019, 6 pages.

* cited by examiner

100

BONDING ALIGNMENT MARKS AT BONDING IN INTERFACE

CROSS REFERENCE TO RELATED APPLICATION

This application is continuation of International Application No. PCT/CN2018/116664, filed on Nov. 21, 2018, entitled "BONDING ALIGNMENT MARKS AT BONDING INTERFACE," which is hereby incorporated by reference in its entirety.

BACKGROUND

Embodiments of the present disclosure relate to bonded semiconductor structures and fabrication methods thereof.

Planar semiconductor devices, such as memory cells, are scaled to smaller sizes by improving process technology, circuit design, programming algorithm, and fabrication process. However, as feature sizes of the semiconductor devices approach a lower limit, planar process and fabrication techniques become challenging and costly. A three-dimensional (3D) device architecture can address the density limitation in some planar semiconductor devices, for example, Flash memory devices.

A 3D semiconductor device can be formed by stacking semiconductor wafers or dies and interconnecting them vertically using, for instance, through-silicon vias (TSVs) or copper-to-copper (Cu—Cu) connections, so that the resulting structure acts as a single device to achieve performance improvements at reduced power and smaller footprint than conventional planar processes. Among the various techniques for stacking semiconductor substrates, hybrid bonding is recognized as one of the promising techniques because of its capability of forming high-density interconnects.

SUMMARY

Embodiments of semiconductor devices, bonded structures, and fabrication methods thereof are disclosed herein.

In one example, a semiconductor device includes a first semiconductor structure, a second semiconductor structure, and a bonding interface between the first semiconductor structure and the second semiconductor structure. The first semiconductor structure includes a substrate, a first device layer disposed on the substrate, and a first bonding layer disposed above the first device layer and including a first bonding contact and a first bonding alignment mark. The second semiconductor structure includes a second device layer, and a second bonding layer disposed below the second device layer and including a second bonding contact and a second bonding alignment mark. The first bonding alignment mark is aligned with the second bonding alignment mark at the bonding interface, such that the first bonding contact is aligned with the second bonding contact at the bonding interface.

In another example, a bonded structure includes a first bonding layer including a first bonding contact and a first bonding alignment mark, a second bonding layer including a second bonding contact and a second bonding alignment mark, and a bonding interface between the first bonding layer and the second bonding layer. The first bonding alignment mark is aligned with the second bonding alignment mark at the bonding interface, such that the first bonding contact is aligned with the second bonding contact at the bonding interface. A dimension of each of the first bonding alignment mark and the second bonding alignment mark is not greater than about 15 µm.

In still another example, a method for forming a semiconductor device is disclosed. A first device layer is formed on a first substrate. A first bonding layer including a first bonding contact and a first bonding alignment mark is formed above the first device layer. A second device layer is formed on a second substrate. A second bonding layer including a second bonding contact and a second bonding alignment mark is formed above the second device layer. The first bonding alignment mark is aligned with the second bonding alignment mark, such that the first bonding contact is aligned with the second bonding contact. The first substrate and the second substrate are bonded in a face-to-face manner, so that the first bonding contact is in contact with the second bonding contact at a bonding interface, and the first bonding alignment mark is in contact with the second bonding alignment mark at the bonding interface.

In yet another example, a method for determining a degree of alignment of a bonded structure is disclosed. A first bonding layer including a first bonding contact and a first lithography overlay mark is formed. A second bonding layer including a second bonding contact and a second lithography overlay mark is formed. The first bonding layer and the second bonding layer are bonded in a face-to-face manner at a bonding interface. A degree of alignment between the first lithography overlay mark and the second lithography overlay mark is measured. A degree of alignment between the first bonding contact and the second bonding contact is determined based on the measured degree of alignment between the first lithography overlay mark and the second lithography overlay mark.

BRIEF DESCRIPTION OF THE DRAWINGS

The accompanying drawings, which are incorporated herein and form a part of the specification, illustrate embodiments of the present disclosure and, together with the description, further serve to explain the principles of the present disclosure and to enable a person skilled in the pertinent art to make and use the present disclosure.

Figure 1A:
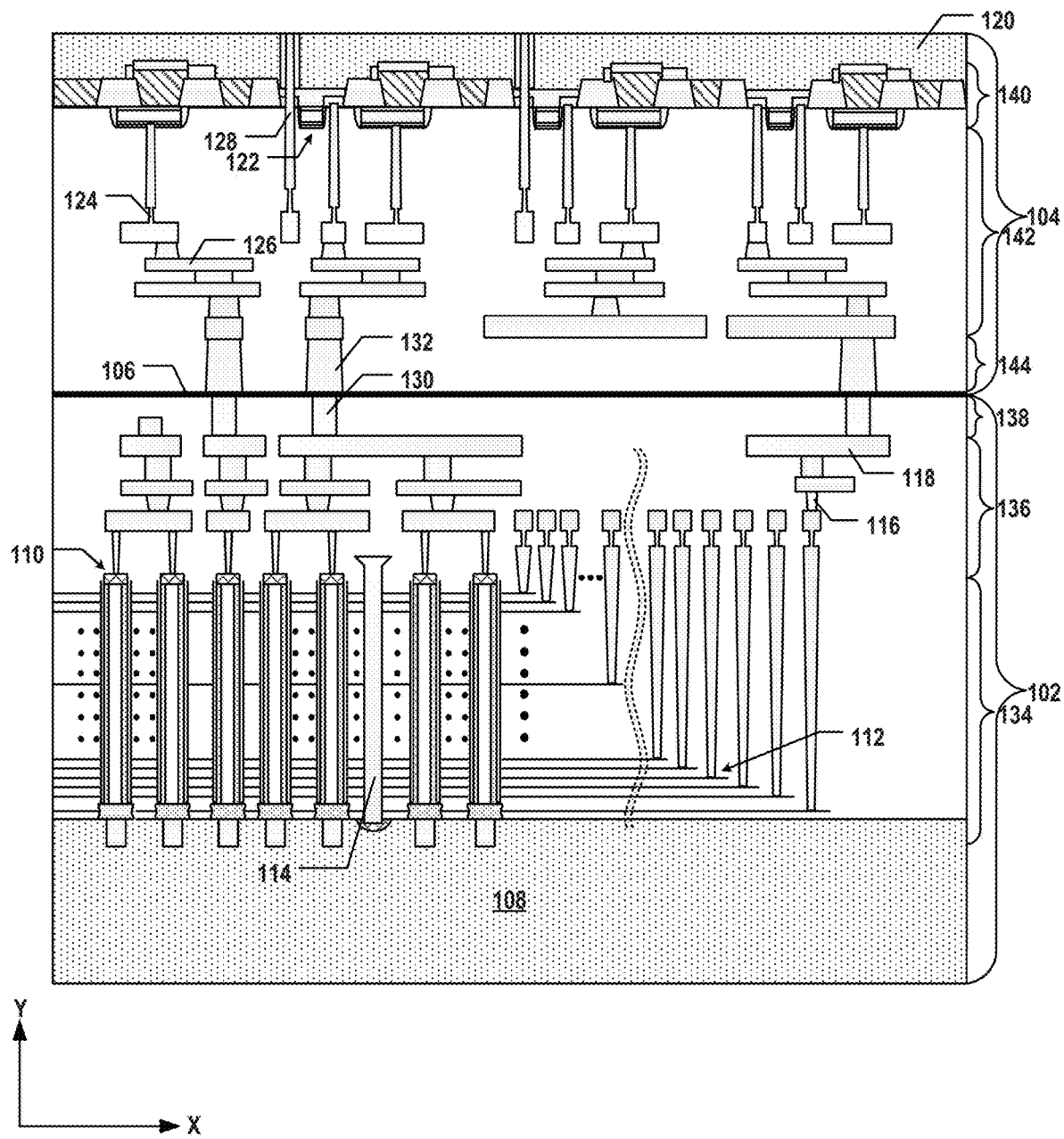
FIG. 1A illustrates a cross-section of an exemplary bonded semiconductor device, according to some embodiments of the present disclosure.

Embodiments of the present disclosure will be described with reference to the accompanying drawings.

DETAILED DESCRIPTION

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one embodiment," "an embodiment," "an example embodiment," "some embodiments," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to effect such feature, structure or characteristic in connection with other embodiments whether or not explicitly described.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer can extend over the entirety of an underlying or overlying structure or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, thereabove, and/or therebelow. A layer can include multiple layers. For example, an interconnect layer can include one or more conductor and contact layers (in which interconnect lines and/or via contacts are formed) and one or more dielectric layers.

As used herein, the term "nominal/nominally" refers to a desired, or target, value of a characteristic or parameter for a component or a process operation, set during the design phase of a product or a process, together with a range of values above and/or below the desired value. The range of values can be due to slight variations in manufacturing processes or tolerances. As used herein, the term "about" indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

As used herein, the term "3D memory device" refers to a semiconductor device with vertically oriented strings of memory cell transistors (referred to herein as "memory strings," such as NAND memory strings) on a laterally-oriented substrate so that the memory strings extend in the vertical direction with respect to the substrate. As used herein, the term "vertical/vertically" means nominally perpendicular to the lateral surface of a substrate.

In the hybrid bonding process, the degree of alignment of the bonding contacts is an important factor affecting the yield. In order to avoid dishing effect and control flatness of the surfaces forming the bonding interface, bonding alignment marks are commonly formed in the interconnect layers away from the bonding interface, which make it impossible to directly measure the degree of alignment of the bonding contacts at the bonding interface.

Various embodiments in accordance with the present disclosure provide bonding alignment marks that can be formed in the bonding layers at the bonding interface of a bonded semiconductor device, thereby enabling the direct measurement of the degree of alignment of bonding contacts at the bonding interface. By forming the bonding alignment marks at the bonding interface, as opposed to in the interconnect layers, the overlay mismatch between the bonding contacts and the interconnect layers can be avoided. The size and/or layout of the bonding alignment marks disclosed herein can be optimized to reduce the dishing effect occurred at the bonding interface. In some embodiments, the alignment marks for lithography overlay are used at the bonding interface as the bonding alignment marks for aligning the bonding contacts using the same instrument for lithography overlay control.

FIG. 1A illustrates a cross-section of an exemplary bonded semiconductor device 100, according to some embodiments of the present disclosure. Bonded semiconductor device 100 represents an example of a non-monolithic 3D memory device. The term "non-monolithic" means that the components of bonded semiconductor device 100 (e.g., peripheral devices and memory array devices) can be formed separately on different substrates and then bonded to form a bonded semiconductor device. Bonded semiconductor device 100 can include a substrate 108, which can include silicon (e.g., single crystalline silicon), silicon germanium (SiGe), gallium arsenide (GaAs), germanium (Ge), silicon on insulator (SOI), or any other suitable materials. For ease of description, bonded semiconductor device 100 will be described as a non-monolithic 3D memory device. However, it is understood that bonded semiconductor device 100 is not limited to a 3D memory device and can include any suitable bonded semiconductor devices that have bonding alignment marks at the bonding interface as described below in detail. It is understood that bonded semiconductor devices that use the bonding alignment marks at the bonding interface as disclosed herein are not limited to the examples shown in FIGS. 1A-1B and can include any other suitable semiconductor devices, such as logic devices, volatile memory devices (e.g., dynamic random-access memory (DRAM) and static random-access memory (SRAM)), and non-volatile memory devices (e.g., Flash memory), in a 2D, 2.5D, or 3D architecture.

Bonded semiconductor device 100 can include two semiconductor structures, i.e., a memory array device chip 102 and a peripheral device chip 104 bonded on top of memory array device chip 102 in a face-to-face manner at a bonding interface 106. In some embodiments, bonding interface 106 is disposed between memory array device chip 102 and peripheral device chip 104 as a result of hybrid bonding (also known as "metal/dielectric hybrid bonding"), which is a direct bonding technology (e.g., forming bonding between surfaces without using intermediate layers, such as solder or adhesives) and can obtain metal-metal bonding and dielectric-dielectric bonding simultaneously. In some embodiments, bonding interface 106 is the place at which memory array device chip 102 and peripheral device chip 104 are met and bonded. In practice, bonding interface 106 can be a layer with a certain thickness that includes the top surface of memory array device chip 102 and the bottom surface of peripheral device chip 104.

It is noted that x and y axes are included in FIG. 1A to further illustrate the spatial relationship of the components in bonded semiconductor device 100 having substrate 108. Substrate 108 includes two lateral surfaces (e.g., a top surface and a bottom surface) extending laterally in the x-direction (i.e., the lateral direction). As used herein, whether one component (e.g., a layer or a device) is "on," "above," or "below" another component (e.g., a layer or a device) of a semiconductor device (e.g., bonded semiconductor device 100) is determined relative to the substrate of the semiconductor device (e.g., substrate 108) in the y-direction (i.e., the vertical direction) when the substrate is positioned in the lowest plane of the semiconductor device in the y-direction. The same notion for describing spatial relationship is applied throughout the present disclosure.

In some embodiments, memory array device chip 102 is a NAND Flash memory device in which memory cells are provided in the form of an array of NAND memory strings 110 in a memory array device layer 134. Memory array device layer 134 can be disposed on substrate 108. In some embodiments, each NAND memory string 110 extends vertically through a plurality of pairs each including a conductor layer and a dielectric layer (referred to herein as "conductor/dielectric layer pairs"). The stacked conductor/dielectric layer pairs are collectively referred to herein as a "memory stack" 112 in memory array device layer 134. The conductor layers and dielectric layers in memory stack 112 can stack alternatingly in the vertical direction. Each NAND memory string 110 can include a semiconductor channel and a composite dielectric layer (also known as a "memory film") including a tunneling layer, a storage layer (also known as a "charge trap/storage layer"), and a blocking layer (not shown). In some embodiments, memory array device layer 134 further includes a gate line slit ("GLS") 114 that extends vertically through memory stack 112. GLS 114 can be used to form the conductor/dielectric layer pairs in memory stack 112 by a gate replacement process and can be filled with conductive materials for electrically connecting an array common source (ACS).

In some embodiments, memory array device chip 102 also includes an array interconnect layer 136 above memory array device layer 134 for transferring electrical signals to and from NAND memory strings 110. As shown in FIG. 1A, array interconnect layer 136 can include a plurality of interconnects (also referred to herein as "contacts"), including vertical interconnect access (via) contacts 116 and lateral interconnect lines 118. As used herein, the term "interconnects" can broadly include any suitable types of interconnects, such as middle-end-of-line (MEOL) interconnects and back-end-of-line (BEOL) interconnects. Array interconnect layer 136 can further include one or more interlayer dielectric (ILD) layers (also known as "intermetal dielectric (IMD) layers") in which interconnect lines 118 and via contacts 116 can form.

As shown in FIG. 1A, memory array device chip 102 can further include a bonding layer 138 at bonding interface 106 and above array interconnect layer 136 and memory array device layer 134. Bonding layer 138 can include a plurality of bonding contacts 130 and dielectrics electrically isolating bonding contacts 130. Bonding contacts 130 can include conductive materials including, but not limited to, tungsten (W), cobalt (Co), copper (Cu), aluminum (Al), silicides, or any combination thereof. The remaining area of bonding layer 138 can be formed with dielectrics including, but not limited to, silicon oxide, silicon nitride, silicon oxynitride, low-k dielectrics, or any combination thereof. Bonding contacts 130 and surrounding dielectrics in bonding layer 138 can be used for hybrid bonding.

Peripheral device chip 104 can include a plurality of transistors 122 in a peripheral device layer 140 disposed below a semiconductor layer 120, such as a thinned substrate. In some embodiments, peripheral device layer 140 can include any suitable digital, analog, and/or mixed-signal peripheral circuits used for facilitating the operation of bonded semiconductor device 100. For example, peripheral device layer 140 can include one or more of a page buffer, a decoder (e.g., a row decoder and a column decoder), a sense amplifier, a driver, a charge pump, a current or voltage reference, or any active or passive components of the circuits (e.g., transistors, diodes, resistors, or capacitors).

Similar to memory array device chip 102, peripheral device chip 104 can also include a peripheral interconnect layer 142 disposed below peripheral device layer 140 for transferring electrical signals to and from transistors 122. Peripheral interconnect layer 142 can include a plurality of interconnects, including interconnect lines 126 and via contacts 124 in one or more ILD layers. In some embodiments, peripheral device chip 104 also include via contacts 128 (e.g., through silicon vias (TSVs) if semiconductor layer 120 is a thinned silicon substrate) extending vertically through semiconductor layer 120. In some embodiments, peripheral device chip 104 further includes a BEOL interconnect layer (not shown) above transistors 122 and semiconductor layer 120. In some embodiments, the BEOL interconnect layer includes any suitable BEOL interconnects and contact pads that can transfer electrical signals between bonded semiconductor device 100 and external circuits.

As shown in FIG. 1A, peripheral device chip 104 can further include a bonding layer 144 at bonding interface 106 and below peripheral interconnect layer 142 and peripheral device layer 140. Bonding layer 144 can include a plurality of bonding contacts 132 and dielectrics electrically isolating bonding contacts 132. Bonding contacts 132 can include conductive materials including, but not limited to, W, Co, Cu, Al, silicides, or any combination thereof. The remaining area of bonding layer 144 can be formed with dielectrics including, but not limited to, silicon oxide, silicon nitride, silicon oxynitride, low-k dielectrics, or any combination thereof. Bonding contacts 132 and surrounding dielectrics in bonding layer 144 can be used for hybrid bonding.

As described below in detail, bonding alignment marks (not shown) can be formed in bonding layers 138 and 144 at bonding interface 106 for aligning bonding contacts 130 and 132 during the bonding process and/or for measuring the degree of alignment of bonding contacts 130 and 132 after the bonding process. By arranging the bonding alignment marks in the same layer (e.g., in bonding layers 138 and 144) as bonding contacts 130 and 132 at bonding interface 106, misalignment and measurement error can be significantly reduced compared to the examples in which the bonding alignment marks are arranged in the interconnect layers (e.g., array interconnect layer 136 and peripheral interconnect layer 142) away from bonding interface 106.

Figure 1B:
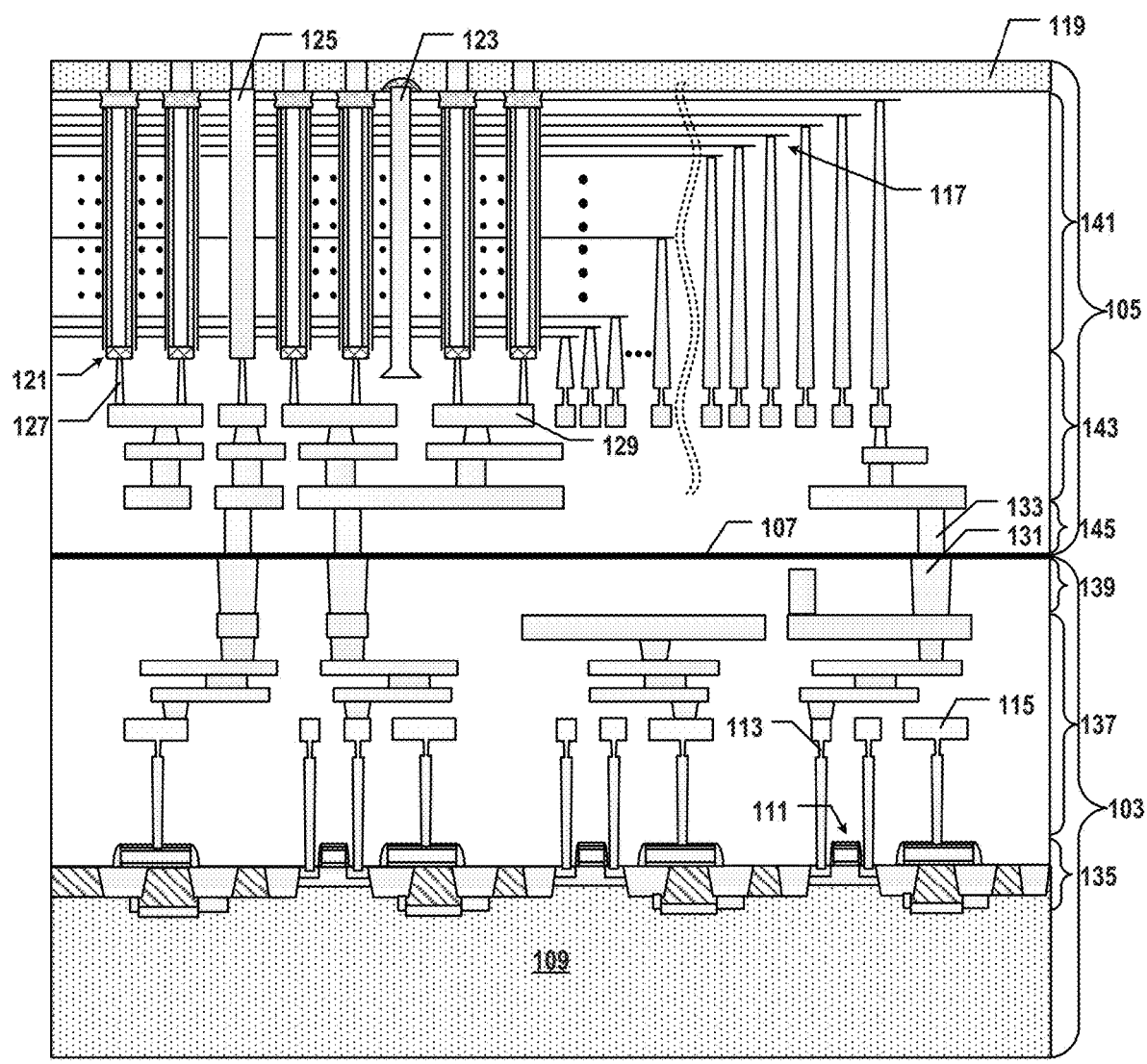
FIG. 1B illustrates a cross-section of another exemplary bonded semiconductor device, according to some embodiments of the present disclosure.

FIG. 1B illustrates a cross-section of another exemplary bonded semiconductor device 101, according to some embodiments of the present disclosure. Similar to bonded semiconductor device 100 described above in FIG. 1A, bonded semiconductor device 101 represents an example of a non-monolithic 3D memory device in which two semiconductor structures, i.e., a peripheral device chip 103 and a memory array device chip 105 are formed separately and bonded in a face-to-face manner at a bonding interface 107. In some embodiments, bonding interface 107 is the place at which memory array device chip 105 and peripheral device chip 103 are met and bonded. In practice, bonding interface 107 can be a layer with a certain thickness that includes the top surface of peripheral device chip 103 and the bottom surface of memory array device chip 105. Different from bonded semiconductor device 100 described above in FIG. 1A in which peripheral device chip 104 is above memory array device chip 102, bonded semiconductor device 101 in FIG. 1B includes peripheral device chip 103 disposed below memory array device chip 105. It is understood that the details of similar structures (e.g., materials, fabrication process, functions, etc.) in both bonded semiconductor devices 100 and 101 may not be repeated below.

Peripheral device chip 103 can include a plurality of transistors 111 in a peripheral device layer 135 disposed on and/or in a substrate 109. In some embodiments, peripheral device layer 135 can include any suitable digital, analog, and/or mixed-signal peripheral circuits used for facilitating the operation of bonded semiconductor device 101. For example, peripheral device layer 135 can include one or more of a page buffer, a decoder (e.g., a row decoder and a column decoder), a sense amplifier, a driver, a charge pump, a current or voltage reference, or any active or passive components of the circuits (e.g., transistors, diodes, resistors, or capacitors). Peripheral device chip 103 can also include a peripheral interconnect layer 137 above peripheral device layer 135 for transferring electrical signals to and from transistors 111. Peripheral interconnect layer 137 can include a plurality of interconnects, including interconnect lines 115 and via contacts 113 in one or more ILD layers. As shown in FIG. 1B, peripheral device chip 103 further includes a bonding layer 139 at bonding interface 107 and above peripheral interconnect layer 137 and peripheral device layer 135. Bonding layer 139 can include a plurality of bonding contacts 131 and dielectrics electrically isolating bonding contacts 131.

In some embodiments, memory array device chip 105 is a NAND Flash memory device in which memory cells are provided in the form of an array of NAND memory strings 121 in a memory array device layer 141 disposed below a semiconductor layer 119 (e.g., a thinned substrate). In some embodiments, each NAND memory string 121 extends vertically through a memory stack 117 in memory array device layer 141. Each NAND memory string 121 can include a semiconductor channel and a composite dielectric layer (also known as a "memory film") including a tunneling layer, a storage layer (also known as a "charge trap/storage layer"), and a blocking layer (not shown). In some embodiments, memory array device chip 105 further includes a GLS 123 that extends vertically through memory stack 117. GLS 123 can be used to form the conductor/dielectric layer pairs in memory stack 117 by a gate replacement process and can be filled with conductive materials for electrically connecting an array common source ACS.

Memory array device chip 105 can also include an array interconnect layer 143 below memory array device layer 141 for transferring electrical signals to and from NAND memory strings 121. Array interconnect layer 143 can include a plurality of interconnects, including interconnect lines 129 and via contacts 127 in one or more ILD layers. Memory array device chip 105 can also include a BEOL interconnect layer (not shown) above NAND memory strings 121 and semiconductor layer 119. In some embodiments, the BEOL interconnect layer includes any suitable BEOL interconnects and contact pads that can transfer electrical signals between bonded semiconductor device 101 and external circuits. In some embodiments, memory array device chip 105 further includes one or more through array contacts (TACs) 125 that extend vertically through the entirety of memory stack 117 and at least part of semiconductor layer 119. The upper end of TAC 125 can contact an interconnect in the BEOL interconnect layer (not shown), and the lower end of TAC 125 can contact another interconnect 127 or 129 in array interconnect layer 143. TAC 125 can thus make an electrical connection between peripheral interconnect layer 137 and the BEOL interconnect layer and carry electrical signals from peripheral device chip 103 to the BEOL interconnects of bonded semiconductor device 101. As shown in FIG. 1B, memory array device chip 105 can further include a bonding layer 145 at bonding interface

107 and below array interconnect layer 143 and memory array device layer 141. Bonding layer 145 can include a plurality of bonding contacts 133 and dielectrics electrically isolating bonding contacts 133.

As described below in detail, bonding alignment marks (not shown) can be formed in bonding layers 139 and 145 at bonding interface 107 for aligning bonding contacts 131 and 133 during the bonding process and/or for measuring the degree of alignment of bonding contacts 131 and 133 after the bonding process. By arranging the bonding alignment marks in the same layer (e.g., in bonding layers 139 and 145) as bonding contacts 131 and 133 at bonding interface 107, misalignment and measurement error can be significantly reduced compared to the examples in which the bonding alignment marks are arranged in the interconnect layers (e.g., array interconnect layer 143 and peripheral interconnect layer 137) away from bonding interface 107.

Chemical mechanical polishing (CMP, also known as "chemical mechanical planarization") is a process of smoothing wafer surface with the combination of chemical etching and free abrasive mechanical polishing and is used to planarize the metals (e.g., Cu, Al, W, etc.) of bonding contacts 130, 131, 132, and 133 in bonding layers 138, 139, 144, and 145. During the CMP process, the polishing pad can remove more metal materials in case of large metal patterns compared to small metal patterns. On the other hand, the removal rate is less for dielectrics compared with metals. As a result, "dishing" (e.g., a dish-shaped curve without metal fill in the side view), which is a manufacturing defect, can occur at the bonding interface when the bonding layers include large-sized metal patterns. Since dishing effect can affect flatness of the surfaces of bonding layers at the bonding interface, large-sized metal patterns, including bonding alignment marks, are usually not formed in the bonding layers, but instead are usually formed in the interconnect layers away from the bonding layers.

Figure 2:
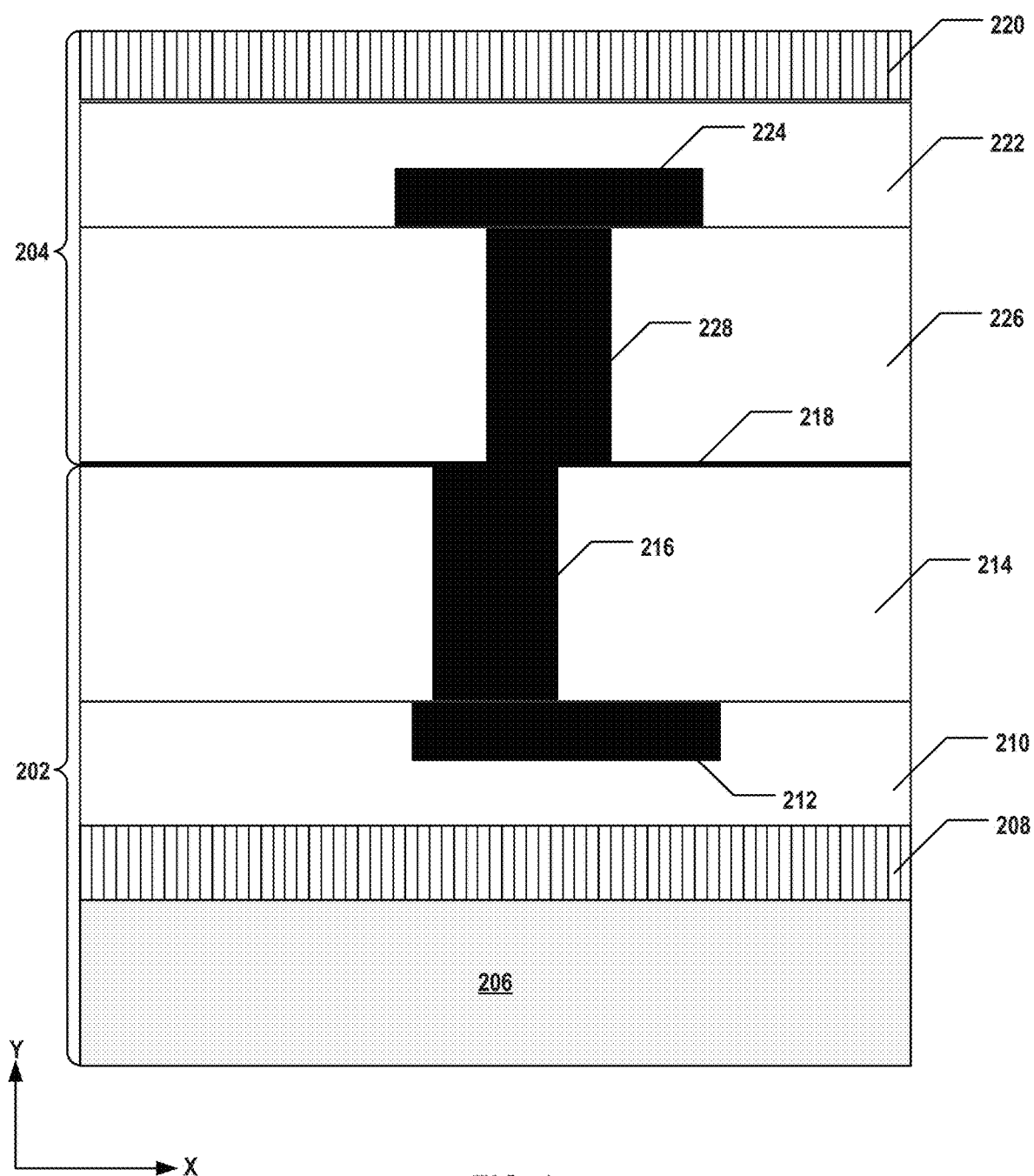
FIG. 2 illustrates a cross-section of a bonded semiconductor device including bonding alignment marks in interconnect layers away from the bonding interface.

For example, FIG. 2 illustrates a cross-section of a bonded semiconductor device 200 including bonding alignment marks 212 and 224 in interconnect layers 210 and 222 away from a bonding interface 218. Bonded semiconductor device 200 includes a first semiconductor structure 202 and a second semiconductor structure 204 bonded in a face-to-face manner at bonding interface 218. First semiconductor structure 202 includes a substrate 206, a first device layer 208 disposed on substrate 206, a first interconnect layer 210 above first device layer 208, and a first bonding layer 214 at bonding interface 218 and above first interconnect layer 210. In some embodiments, bonding interface 218 is the place at which first semiconductor structure 202 and second semiconductor structure 204 are met and bonded. In practice, bonding interface 218 can be a layer with a certain thickness that includes the top surface of first semiconductor structure 202 and the bottom surface of second semiconductor structure 204. A first bonding alignment mark 212 and a first bonding contact 216 are formed in different layers, i.e., first interconnect layer 210 and first bonding layer 214, respectively. Each of first bonding alignment mark 212 and first bonding contact 216 is made of a metal, such as Cu, W, Al, Co, etc., and is surrounded by a dielectric, such as silicon oxide or silicon nitride.

Second semiconductor structure 204 includes a second device layer 220, a second interconnect layer 222 below second device layer 220, and a second bonding layer 226 at bonding interface 218 and below second interconnect layer 222. A second bonding alignment mark 224 and a second bonding contact 228 are formed in different layers, i.e., second interconnect layer 222 and second bonding layer 226, respectively. Each of second bonding alignment mark 224 and second bonding contact 228 is made of a metal, such as Cu, W, Al, Co, etc., and is surrounded by a dielectric, such as silicon oxide or silicon nitride.

Figure 3A:
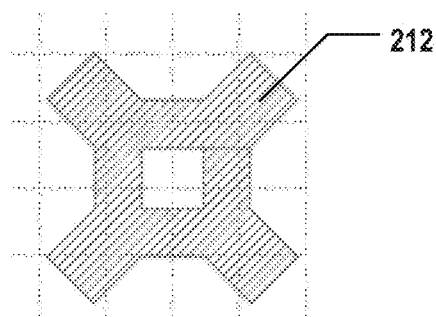
FIGS. 3A-3C illustrate plan views of the bonding alignment marks in interconnect layers away from the bonding interface as illustrated in FIG. 2.
Figure 3B:
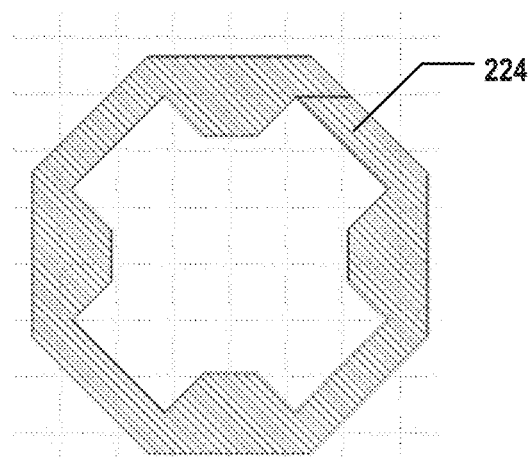
Figure 3C:
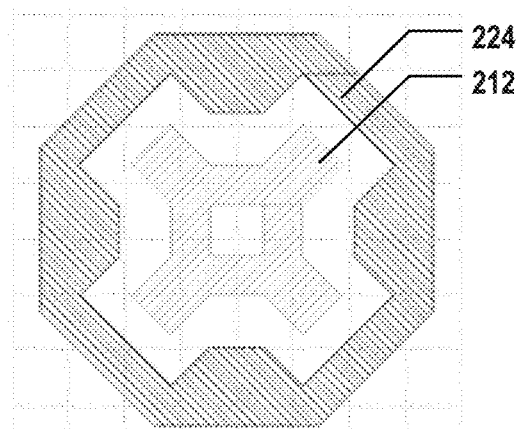

As shown in FIG. 2, first and second bonding alignment marks 212 and 224 are in interconnect layers 210 and 222, respectively, away from bonding interface 218. For example, FIGS. 3A-3C illustrate plan views of bonding alignment marks 212 and 224 in interconnect layers 210 and 222 away from bonding interface 218 as illustrated in FIG. 2. The degree of alignment between bonding alignments marks 212 and 224 (e.g., as shown in FIG. 3C) can only indirectly reflect the degree of alignment between interconnect layers 210 and 222, but not the degree of alignment between bonding contacts 216 and 228 in bonding layers 214 and 226 at bonding interface 218. It is understood that the patterns of bonding alignment marks 212 and 224 may vary in other conventional bonded semiconductor devices. Nevertheless, the size of the conventional bonding alignment marks (e.g., bonding alignment marks 212 and 224) is too large to avoid dishing effect. In some embodiments, a dimension (e.g., the length of a side) of a conventional bonding alignment mark is greater than about 100 µm, such as greater than 100 µm.

Figure 4:
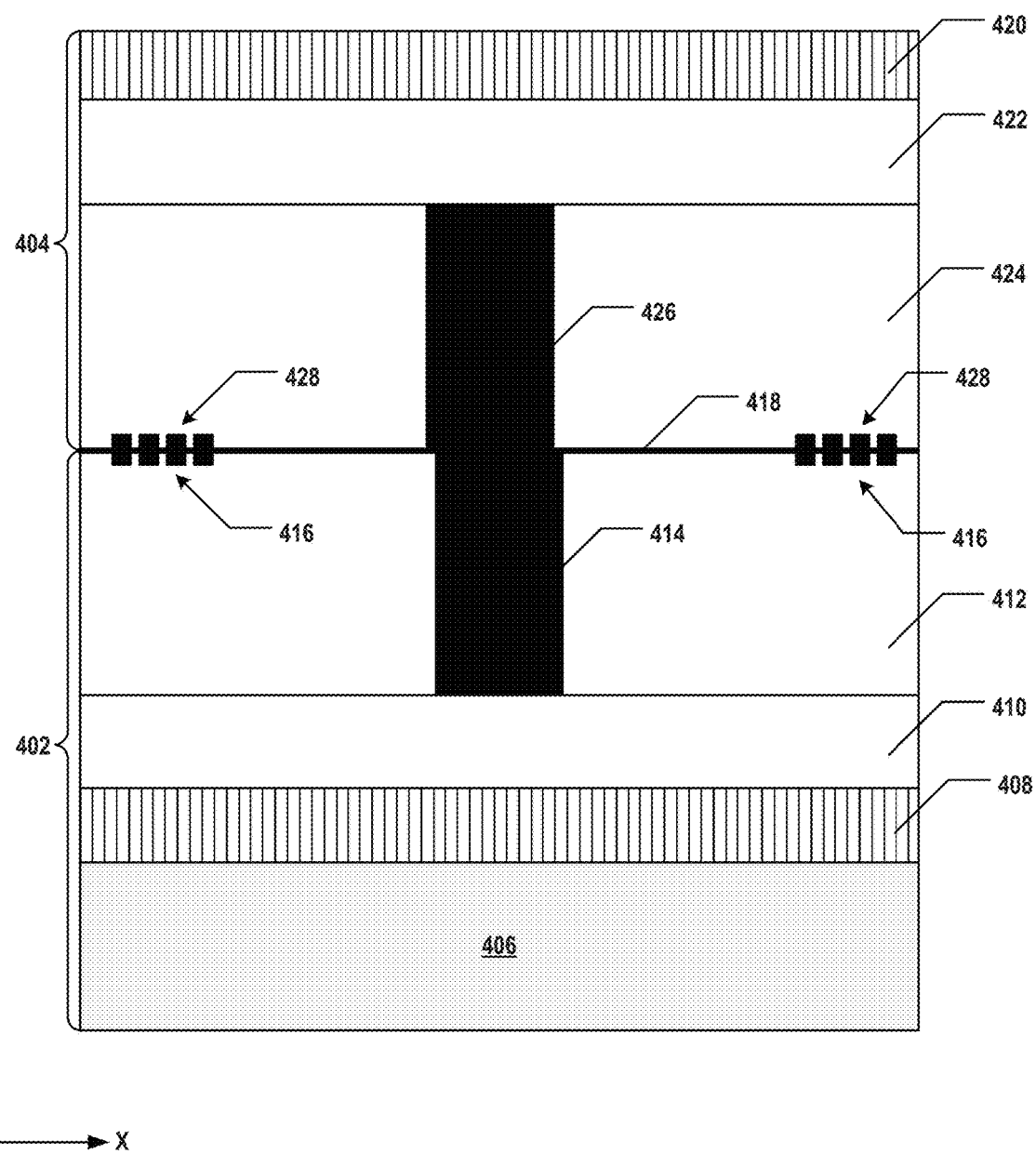
FIG. 4 illustrates a cross-section of an exemplary bonded semiconductor device including bonding alignment marks in bonding layers at the bonding interface, according to some embodiments of the present disclosure.

FIG. 4 illustrates a cross-section of an exemplary bonded semiconductor device 400 including bonding alignment marks 416 and 428 in bonding layers 412 and 424 at a bonding interface 418, according to some embodiments of the present disclosure. Bonded semiconductor device 400 can be a bonded memory device (e.g., bonded semiconductor devices 100 and 101) or any suitable bonded semiconductor devices, such as logic devices, volatile memory devices, and non-volatile memory devices. Bonded semiconductor device 400 can include a first semiconductor structure 402 and a second semiconductor structure 404 bonded in a face-to-face manner at bonding interface 418. In some embodiments, bonding interface 418 is the place at which first semiconductor structure 402 and second semiconductor structure 404 are met and bonded. In practice, bonding interface 418 can be a layer with a certain thickness that includes the top surface of first semiconductor structure 402 and the bottom surface of second semiconductor structure 404. Different from the conventional bonded semiconductor devices (e.g., bonded semiconductor device 200) in which the large-sized bonding alignment marks are away from the bonding interface, bonding alignment marks 416 and 428 in FIG. 4 are at bonding interface 418, which enables the direct measurement of the degree of alignment of bonding contacts 414 and 426 at bonding interface 418 before, during, or after the bonding process.

As shown in FIG. 4, first semiconductor structure 402 can include a substrate 406, a first device layer 408 disposed on substrate 406, a first interconnect layer 410 above first device layer 408, and a first bonding layer 412 at bonding interface 418 and above first interconnect layer 410. In some embodiments, first semiconductor structure 402 is a memory array device chip, and first device layer 408 is a memory array device layer that includes an array of NAND memory strings, such as NAND memory strings 110 in FIG. 1A. In some embodiments, first semiconductor structure 402 is a peripheral device chip, and first device layer 408 is a peripheral device layer that includes peripheral devices, such as transistors 111 in FIG. 1B. First interconnect layer 410 between first device layer 408 and first bonding layer 412 can include interconnect lines and via contacts in one or more ILD layers. First interconnect layer 410 does not include a bonding alignment mark for aligning first and second bonding contacts 414 and 426, according to some embodiments, which is different from the conventional bonded semiconductor devices.

In some embodiments, first bonding layer 412 includes first bonding contact 414 and first bonding alignment marks 416 both at bonding interface 418. First bonding contact 414 and first bonding alignment marks 416 can be made of metals, such as Cu, W, Al, Co, etc., and surrounded by dielectrics, such as silicon oxide or silicon nitride. In one example, first bonding contact 414 and first bonding alignment marks 416 are made of copper, and the dielectrics in first bonding layer 412 electrically isolating first bonding contact 414 and first bonding alignment marks 416 are made of silicon oxide. First bonding contact 414 can be electrically connected to the interconnects (not shown) in first interconnect layer 410, while first bonding alignment marks 416 are electrically separated from the interconnects in first interconnect layer 410, for example, by having a thickness smaller than the thickness of first bonding layer 412 (and first bonding contact 414 therein). It is understood that in some embodiments, the thickness of first bonding alignment marks 416 is the same as that of first bonding layer 412 (and first bonding contact 414 therein).

As shown in FIG. 4, second semiconductor structure 404 include a second device layer 420, a second interconnect layer 422 below second device layer 420, and a second bonding layer 424 at bonding interface 418 and below second interconnect layer 422. In some embodiments, second semiconductor structure 404 is a memory array device chip, and second device layer 420 is a memory array device layer that includes an array of NAND memory strings, such as NAND memory strings 121 in FIG. 1B. In some embodiments, second semiconductor structure 404 is a peripheral device chip, and second device layer 420 is a peripheral device layer that includes peripheral devices, such as transistors 122 in FIG. 1A. Second interconnect layer 422 between second device layer 420 and bonding layer 424 can include interconnect lines and via contacts in one or more ILD layers. Second interconnect layer 422 does not include a bonding alignment mark for aligning first and second bonding contacts 414 and 426, according to some embodiments, which is different from the conventional bonded semiconductor devices.

In some embodiments, second bonding layer 424 can include second bonding contact 426 and second bonding alignment marks 428 both at bonding interface 418. Second bonding contact 426 and second bonding alignment marks 428 can be made of metals, such as Cu, W, Al, Co, etc., and surrounded by dielectrics, such as silicon oxide or silicon nitride. In one example, second bonding contact 426 and second bonding alignment marks 428 are made of copper, and the dielectrics in second bonding layer 424 electrically isolating second bonding contact 426 and second bonding alignment marks 428 are made of silicon oxide. Second bonding contact 426 can be electrically connected to the interconnects (not shown) in second interconnect layer 422, while second bonding alignment marks 428 are electrically separated from the interconnects in second interconnect layer 422, for example, by having a thickness smaller than the thickness of second bonding layer 424 (and second bonding contact 426 therein). It is understood that in some embodiments, the thickness of second bonding alignment marks 428 is the same as that of second bonding layer 424 (and second bonding contact 426 therein). In addition to first and second bonding contacts 414 and 426, the dielectrics in first and second bonding layers 412 and 424 can be in contact with each other at bonding interface 418 as well.

Although not shown in FIG. 4, it is understood that in some embodiments, a semiconductor layer (e.g., a thinned substrate) and/or a BEOL interconnect layer are disposed above second device layer 420.

First bonding alignment mark 416 and second bonding alignment mark 428 can be used for aligning first bonding contact 414 and second bonding contact 426 during a bonding process, e.g., hybrid bonding process, for forming bonded semiconductor structure 400. As shown in FIG. 4, in some embodiments, first bonding alignment mark 416 is aligned with second bonding alignment mark 428 at bonding interface 418, such that first bonding contact 414 is aligned with second bonding contact 426 at bonding interface 418. Alternatively or additionally, first bonding alignment mark 416 and second bonding alignment mark 428 can be used for measuring the degree of alignment of first bonding contact 414 and second bonding contact 426 after the bonding process, for example, for quality control or tuning the bonding parameters. The degree of alignment is used for aligning first bonding contact 414 and second bonding contact 426 during the bonding process, for example, to determine when the alignment is completed, according to some embodiments. In some embodiments, the degree of alignment is determined based on the degree of overlap between two patterns (e.g., first and second bonding contacts 414 and 426 or first and second bonding alignment marks 416 and 428) at bonding interface 418. In some embodiments, first and second bonding contacts 414 and 426 are considered as aligned when the degree of alignment of first and second bonding contacts 414 and 426 is within a threshold. In some embodiments, first and second bonding contacts 414 and 426 are considered as aligned when the degree of alignment of first and second bonding alignment marks is within a threshold. The threshold can be 100% or less than 100%. That is, a certain offset may be acceptable in aligning first and second bonding contacts 414 and 426.

In order to avoid dishing effect of bonding alignment marks 416 and 428 at bonding interface 418, the size of bonding alignment marks 416 and 428 is relatively small compared with conventional bonding alignment marks in interconnect layers. In some embodiments, a dimension of each of first and second bonding alignment marks 416 and 428 is not greater than about 15 μm, such as not greater than 15 μm. In some embodiments, the dimension of each of first and second bonding alignment marks 416 and 428 is between about 1 μm and about 15 μm, such as between 1 μm and 15 μm (e.g., 1 μm, 2 μm, 3 μm, 4 μm, 5 μm, 6 μm, 7 μm, 8 μm, 9 μm, 10 μm, any range bounded by the lower end by any of these values, or any range defined by any two of these values). In some embodiments, the dimension of each of first and second bonding alignment marks 416 and 428 is about 10 μm, such as 10 μm. The dimension can be a dimension of bonding alignment mark 416 or 428 in the plan view (i.e., not including the thickness in the vertical direction), such as the length of a side. In some embodiments, the dimension is the smallest length of different sides.

Figure 5A:
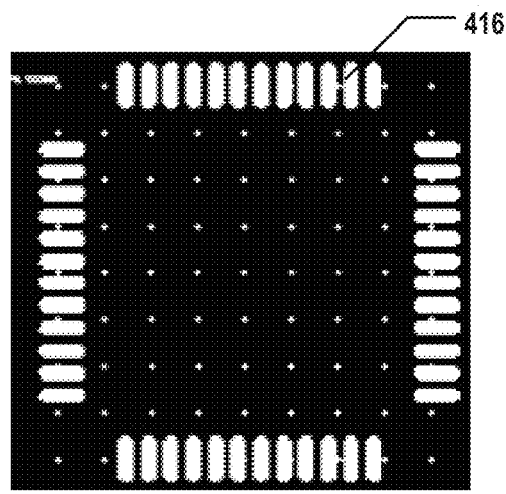
FIGS. 5A-5C illustrate plan views of exemplary bonding alignment marks in bonding layers at the bonding interface as illustrated in FIG. 4, according to some embodiments of the present disclosure.
Figure 5B:
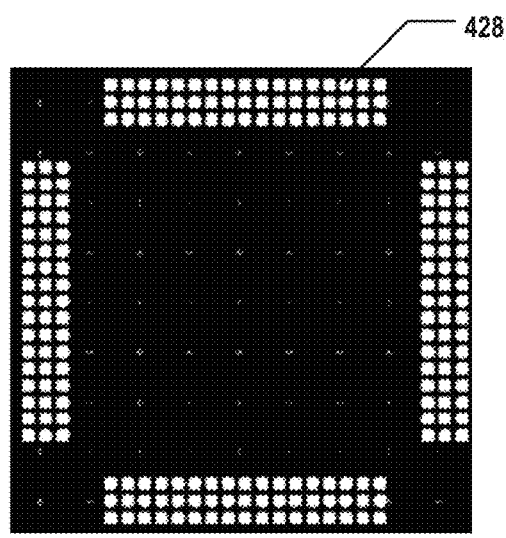
Figure 5C:
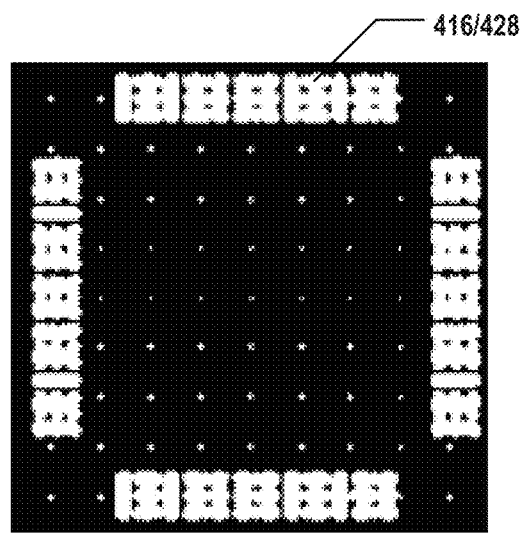

In some embodiments, at least one of bonding alignment marks 416 and 428 is not a single pattern but includes a plurality of repetitive patterns. That is, the same pattern can be repeated to form bonding alignment mark 416 and/or 428. For example, FIGS. 5A-5C illustrate plan views of exemplary bonding alignment marks 416 and 428 in bonding layers 412 and 424 at bonding interface 418 of bonded semiconductor device 400, according to some embodiments of the present disclosure. As shown in FIG. 5A, four bonding alignment marks 416 are formed at each side of first semiconductor structure 402 (e.g., a wafer or each die of a wafer)

in the plan view, according to some embodiments. Each bonding alignment mark 416 can include a plurality of repetitive strips. Each strip can be a metal region (the bright region) separated by adjacent dielectric regions (the dark regions).

Figure 6A:
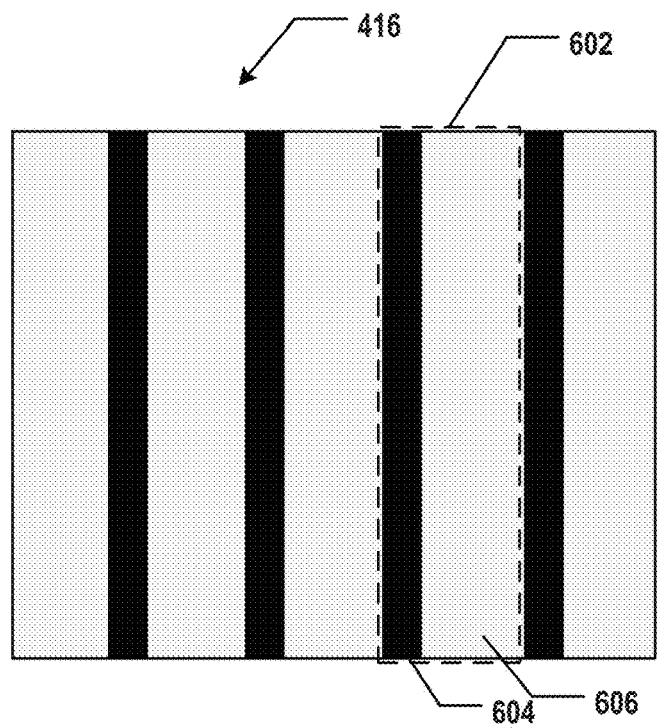
FIGS. 6A-6B illustrate enlarged plan views of the exemplary bonding alignment marks illustrated in FIGS. 5A-5C, according to some embodiments of the present disclosure.

As further illustrated in FIG. 6A, each bonding alignment mark 416 includes a plurality of repetitive patterns 602, each of which includes a metal region 604 and a dielectric region 606. In some embodiments, a dimension of each repetitive pattern 602 is not greater than about 1 µm, such as not greater than 1 µm. In some embodiments, the dimension of each repetitive pattern 602 is between about 100 nm and about 1 µm, such as between 100 nm and 1 µm (e.g., 100 nm, 200 nm, 300 nm, 400 nm, 500 nm, 600 nm, 700 nm, 800 nm, 900 nm, 1 µm, any range bounded by the lower end by any of these values, or any range defined by any two of these values). The dimension can be a dimension of repetitive pattern 602 in the plan view (i.e., not including the thickness in the vertical direction), such as the length of a side. In some embodiments, the dimension is the smallest length of different sides. In some embodiments, the size of metal region 604 is not greater than about 25%, such as not greater than 25%, of the size of repetitive pattern 602. In some embodiments, the size of metal region 604 is between about 1% and about 25%, such as between 1% and 25%, of the size of repetitive pattern 602, (e.g., 1%, 2%, 3%, 4%, 5%, 6%, 7%, 8%, 9%, 10%, 11%, 12%, 13%, 14%, 15%, 16%, 17%, 18%, 19%, 20%, 21%, 22%, 23%, 24%, 25%, any range bounded by the lower end by any of these values, or any range defined by any two of these values). The dimension, size, and/or layout described above with respect to bonding alignment marks 416 can effectively reduce dishing effect of bonding alignment mark 416 at bonding interface 418.

As shown in FIG. 5B, four bonding alignment marks 428 are formed at each side of second semiconductor structure 404 (e.g., another wafer or each die of another wafer) in the plan view, according to some embodiments. Each bonding alignment mark 428 can include a plurality of repetitive squares. Each square can be a metal region (the bright region) separated by adjacent dielectric regions (the dark regions).

Figure 6B:
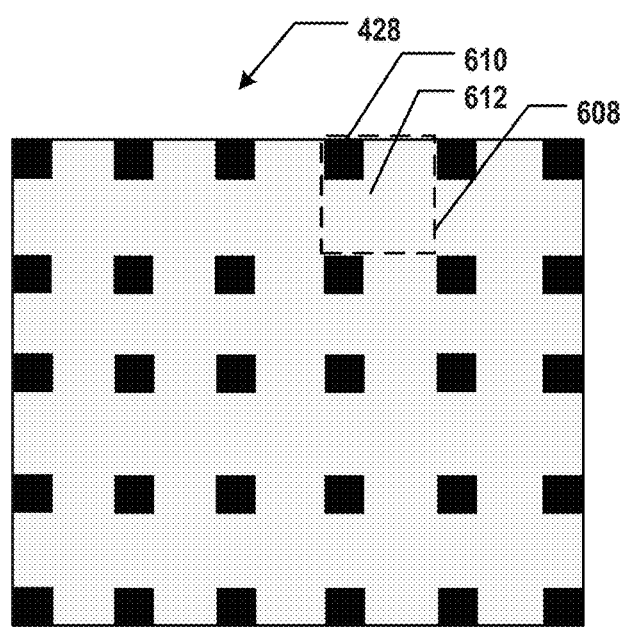

As further illustrated in FIG. 6B, each bonding alignment mark 428 includes a plurality of repetitive patterns 608, each of which includes a metal region 610 and a dielectric region 612. In some embodiments, a dimension of each repetitive pattern 608 is not greater than about 1 µm, such as not greater than 1 µm. In some embodiments, the dimension of each repetitive pattern 608 is between about 100 nm and about 1 µm, such as between 100 nm and 1 µm (e.g., 100 nm, 200 nm, 300 nm, 400 nm, 500 nm, 600 nm, 700 nm, 800 nm, 900 nm, 1 µm, any range bounded by the lower end by any of these values, or any range defined by any two of these values). The dimension can be a dimension of repetitive pattern 608 in the plan view (i.e., not including the thickness in the vertical direction), such as the length of a side. In some embodiments, the dimension is the smallest length of different sides. In some embodiments, the size of metal region 610 is not greater than about 25%, such as not greater than 25%, of the size of repetitive pattern 608. In some embodiments, the size of metal region 610 is between about 1% and about 25%, such as between 1% and 25%, of the size of repetitive pattern 608, (e.g., 1%, 2%, 3%, 4%, 5%, 6%, 7%, 8%, 9%, 10%, 11%, 12%, 13%, 14%, 15%, 16%, 17%, 18%, 19%, 20%, 21%, 22%, 23%, 24%, 25%, any range bounded by the lower end by any of these values, or any range defined by any two of these values). The dimension, size, and/or layout described above with respect to bonding alignment marks 428 can effectively reduce dishing effect of bonding alignment mark 428 at bonding interface 418.

In some embodiments, at least one of first and second bonding alignment marks 416 and 428 is a lithography overlay mark. Lithography overlay mark can be used for overlay control, which defines the control of pattern-to-pattern alignment in multiple lithography processes during the fabrication of bonded semiconductor device 400. In some embodiments, the existing lithography overlay marks formed in bonding layers 412 and 424 are used as bonding alignment marks 416 and 428. In other words, no additional dedicated bonding alignment marks may be needed in some embodiments. For example, as shown in FIG. 5C, both bonding alignment marks 416 and 428 may be lithography overlay marks at bonding interface 418, which can be used for measuring the degree of alignment of bonded semiconductor device 400. In some embodiments, the degree of alignment between lithography overlay marks is measured using infrared light, for example, using the same infrared light measurement instrument for overlay control measurement.

Figure 7:
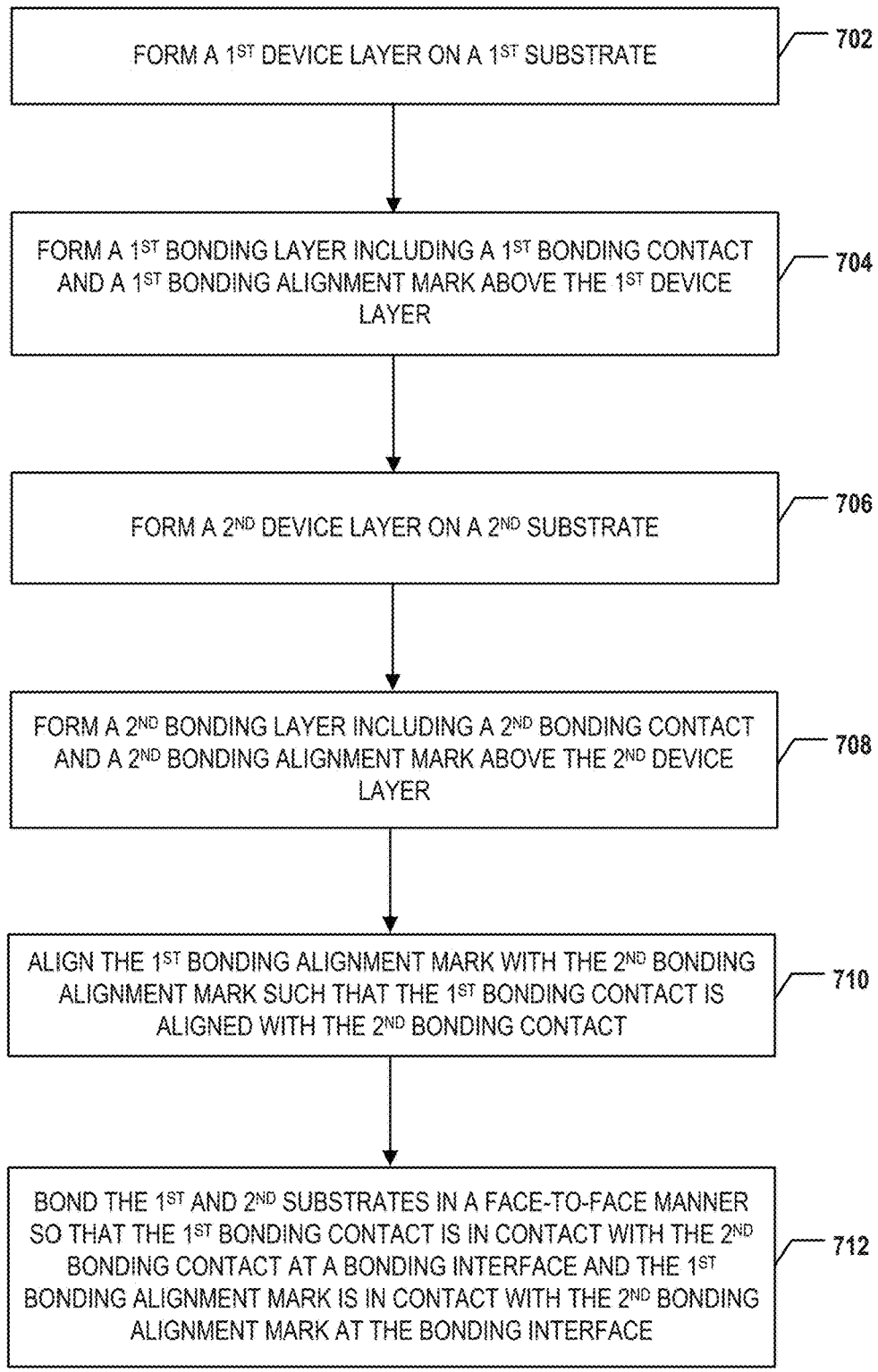
FIG. 7 is a flowchart of an exemplary method for forming a semiconductor device including bonding alignment marks at the bonding interface, according to some embodiments of the present disclosure.

FIG. 7 is a flowchart of an exemplary method 700 for forming a semiconductor device, according to some embodiments of the present disclosure. Examples of the semiconductor device depicted in FIG. 7 include bonded semiconductor device 400 depicted in FIG. 4. FIGS. 4 and 7 will be described together. It is understood that the operations shown in method 700 are not exhaustive and that other operations can be performed as well before, after, or between any of the illustrated operations. Further, some of the operations may be performed simultaneously, or in a different order than shown in FIG. 7.

Referring to FIG. 7, method 700 starts at operation 702, in which a first device layer is formed on a first substrate. As illustrated in FIG. 4, first device layer 408 is formed on substrate 406. First device layer 408 can be a memory array device layer including a plurality of NAND memory strings (not shown) or a peripheral device layer including a plurality of peripheral devices (not shown).

Method 700 proceeds to operation 704, in which a first bonding layer including a first bonding contact and a first bonding alignment mark is formed above the first device layer. In some embodiments, a first interconnect layer is formed between the first bonding layer and the first device layer. As illustrated in FIG. 4, first bonding layer 412 including first bonding contact 414 and first bonding alignment mark 416 is formed above first device layer 408, and first interconnect layer 410 is formed between first bonding layer 412 and first device layer 408.

Method 700 proceeds to operation 706, in which a second device layer is formed on a second substrate. As illustrated in FIG. 4, second device layer 420 is formed on a substrate (not shown) prior to the bonding. Second device layer 420 can be a memory array device layer including a plurality of NAND memory strings (not shown) or a peripheral device layer including a plurality of peripheral devices (not shown).

Method 700 proceeds to operation 708, in which a second bonding layer including a second bonding contact and a second bonding alignment mark is formed above the second device layer. In some embodiments, a second interconnect layer is formed between the second bonding layer and the second device layer. As illustrated in FIG. 4, prior to the bonding, second bonding layer 424 including second bonding contact 426 and second bonding alignment mark 428 is formed above second device layer 420, and second interconnect layer 422 is formed between second bonding layer 424 and second device layer 420.

In some embodiments, a dimension of each of the first and second bonding alignment marks is not greater than about 15 μm. In one example, the dimension of each of the first and second bonding alignment marks is about 10 μm. For example, the dimension of each of first and second bonding alignment marks 416 and 428 is not greater than 15 μm, such as 10 μm.

In some embodiments, at least one of the first and second bonding alignment marks includes a plurality of repetitive patterns. In some embodiments, a dimension of each of the repetitive patterns is not greater than about 1 μm. For example, each of first and second bonding alignment marks 416 and 428 includes a plurality of repetitive patterns 602 and 608, and the dimension of each of repetitive patterns 602 and 608 is not greater than 1 μm.

In some embodiments, each of the repetitive patterns includes a metal region and a dielectric region. In some embodiments, a size of the metal region is not greater than about 25% of a size of the repetitive pattern. For example, each of repetitive patterns 602 and 608 includes a metal region 604 or 610 and a dielectric region 606 or 612, and the size of metal region 604 or 610 is not greater than about 25% of the size of repetitive pattern 602 or 608.

In some embodiments, at least one of the first and second interconnect layers does not include a bonding alignment mark for aligning the first and second bonding contacts. For example, each of first and second interconnect layers 410 and 422 does not include a bonding alignment mark for aligning first and second bonding contacts 414 and 426.

Method 700 proceeds to operation 710, in which the first bonding alignment mark is aligned with the second bonding alignment mark, such that the first bonding contact is aligned with the second bonding contact. In some embodiments, the alignment is made using infrared red to show both first and second bonding alignment marks. As illustrated in FIG. 4, first bonding alignment mark 416 is aligned with second bonding alignment mark 428, such that first bonding contact 414 is aligned with second bonding contact 426.

Method 700 proceeds to operation 712, in which the first substrate and the second substrate are bonded in a face-to-face manner, so that the first bonding contact is in contact with the second bonding contact at a bonding interface, and the first bonding alignment mark is in contact with the second bonding alignment mark at the bonding interface. In some embodiments, the bonding includes hybrid bonding. As illustrated in FIG. 4, first and second semiconductor structures 402 and 404 are bonded in a face-to-face manner, so that first bonding contact 414 is in contact with second bonding contact 426 at bonding interface 418, and first bonding alignment mark 416 is in contact with second bonding alignment mark 428 at bonding interface 418. The first dielectric in first bonding layer 412 can be in contact with the second dielectric in second bonding layer 424 at bonding interface 418 as well after the bonding.

Figure 8:
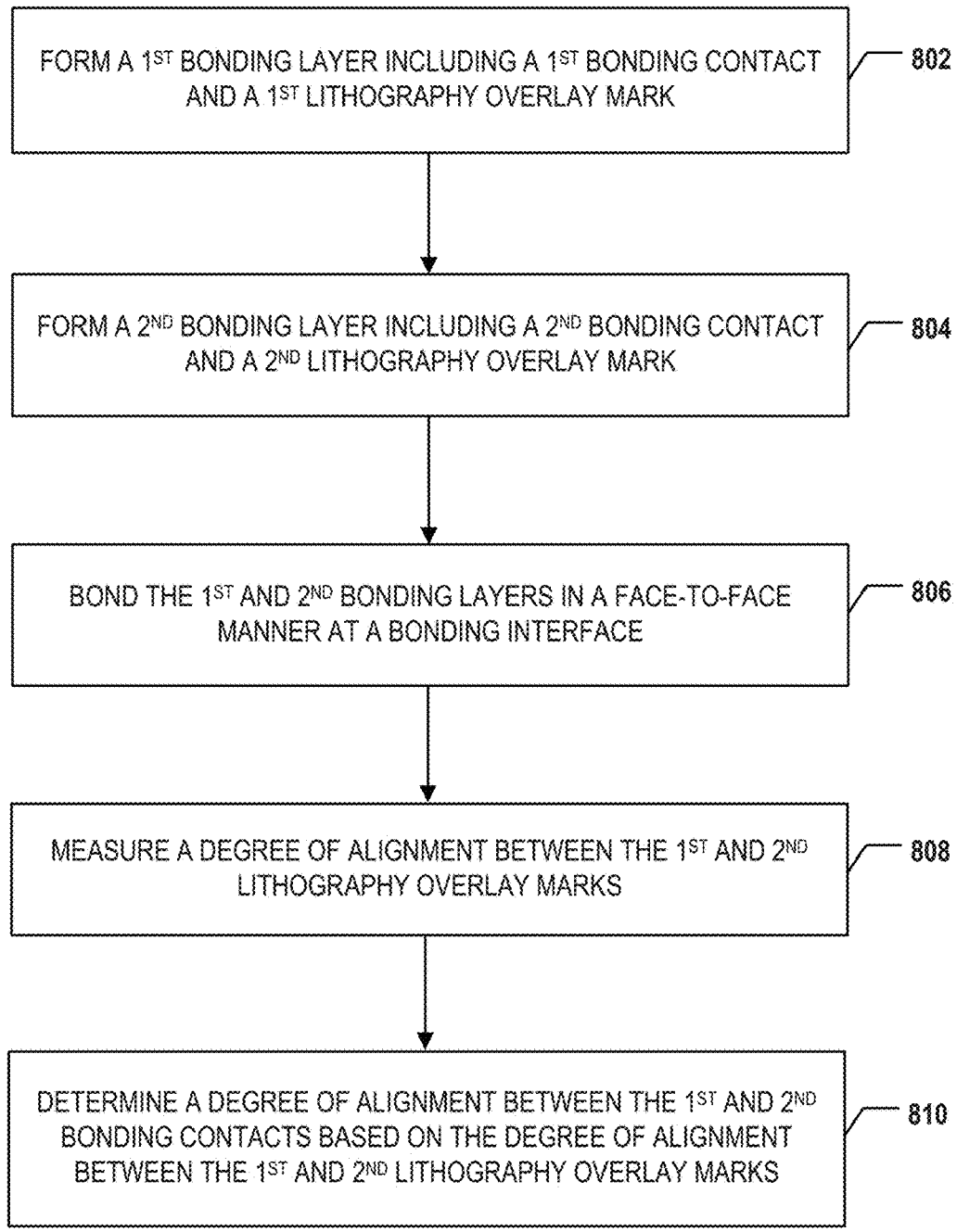
FIG. 8 is a flowchart of an exemplary method for measuring a degree of alignment of a bonded structure, according to some embodiments of the present disclosure.

FIG. 8 is a flowchart of an exemplary method 800 for determining a degree of alignment of a bonded structure, according to some embodiments of the present disclosure. Examples of the bonded structure depicted in FIG. 8 include bonded semiconductor device 400 depicted in FIG. 4. FIGS. 4 and 8 will be described together. It is understood that the operations shown in method 800 are not exhaustive and that other operations can be performed as well before, after, or between any of the illustrated operations. Further, some of the operations may be performed simultaneously, or in a different order than shown in FIG. 8.

Referring to FIG. 8, method 800 starts at operation 802, in which a first bonding layer including a first bonding contact and a first lithography overlay mark is formed. As illustrated in FIG. 4, first bonding layer 412 including first bonding contact 414 and a first lithography overlay mark 416 is formed.

Method 800 proceeds to operation 804, in which a second bonding layer including a second bonding contact and a second lithography overlay mark is formed. As illustrated in FIG. 4, second bonding layer 424 including second bonding contact 426 and a second lithography overlay mark 428 is formed.

Method 800 proceeds to operation 806, in which the first bonding layer and the second bonding layer are bonded in a face-to-face manner at a bonding interface. In some embodiments, the bonding includes hybrid bonding. As illustrated in FIG. 4, first bonding layer 412 and second bonding layer 424 are bonded in a face-to-face manner at bonding interface 418 using hybrid bonding.

Method 800 proceeds to operation 808, in which a degree of alignment between the first lithography overlay mark and the second lithography overlay mark is measured. In some embodiments, the degree of alignment between the first and second lithography overlay marks is measured using infrared light. For example, the degree of alignment between first and second lithography overlay marks 416 and 428 is measured using infrared light. In some embodiments, an infrared light measurement instrument is used to measure the degree of alignment between first and second lithography overlay marks 416 and 428 using infrared light having a wavelength of about 1,000 nm. First and second lithography overlay marks 416 and 428 can be recognized through multiple layers above and/or below first and second bonding layers 412 and 424 because infrared light is transmissive of semiconductor structures, e.g., silicon substrates.

Method 800 proceeds to operation 810, in which a degree of alignment between the first bonding contact and the second bonding contact is determined based on the measured degree of alignment between the first lithography overlay mark and the second lithography overlay mark. In some embodiments, the two degrees of alignment are correlated. For example, the degree of alignment between first and second bonding contacts 414 and 426 may be determined based on the measured degree of alignment between first and second lithography overlay marks 416 and 428.

According to one aspect of the present disclosure, a semiconductor device includes a first semiconductor structure, a second semiconductor structure, and a bonding interface between the first semiconductor structure and the second semiconductor structure. The first semiconductor structure includes a substrate, a first device layer disposed on the substrate, and a first bonding layer disposed above the first device layer and including a first bonding contact and a first bonding alignment mark. The second semiconductor structure includes a second device layer, and a second bonding layer disposed below the second device layer and including a second bonding contact and a second bonding alignment mark. The first bonding alignment mark is aligned with the second bonding alignment mark at the bonding interface, such that the first bonding contact is aligned with the second bonding contact at the bonding interface.

In some embodiments, a dimension of each of the first and second bonding alignment marks is not greater than about 15 μm. The dimension of each of the first and second bonding alignment marks can be about 10 μm.

In some embodiments, at least one of the first and second bonding alignment marks includes a plurality of repetitive patterns. A dimension of each of the repetitive patterns is not greater than about 1 μm, according to some embodiments. In some embodiments, each of the repetitive patterns includes a metal region and a dielectric region. A size of the metal region is not greater than about 25% of a size of the repetitive pattern, according to some embodiments.

In some embodiments, the first semiconductor structure further includes a first interconnect layer between the first device layer and the first bonding layer, the second semiconductor structure further includes a second interconnect layer between the second device layer and the second bonding layer, and at least one of the first and second interconnect layers does not include a bonding alignment mark for aligning the first and second bonding contacts.

In some embodiments, the first bonding layer further includes a first dielectric, and the second bonding layer further includes a second dielectric in contact with the first dielectric at the bonding interface.

In some embodiments, at least one of the first and second bonding alignment marks is a lithography overlay mark.

In some embodiments, one of the first and the second device layers includes a NAND memory string, and another one of the first and the second device layers includes a peripheral device.

According to another aspect of the present disclosure, a bonded structure includes a first bonding layer including a first bonding contact and a first bonding alignment mark, a second bonding layer including a second bonding contact and a second bonding alignment mark, and a bonding interface between the first bonding layer and the second bonding layer. The first bonding alignment mark is aligned with the second bonding alignment mark at the bonding interface, such that the first bonding contact is aligned with the second bonding contact at the bonding interface. A dimension of each of the first bonding alignment mark and the second bonding alignment mark is not greater than about 15 μm.

In some embodiments, the dimension of each of the first and second bonding alignment marks is about 10 μm.

In some embodiments, at least one of the first and second bonding alignment marks includes a plurality of repetitive patterns. A dimension of each of the repetitive patterns is not greater than about 1 μm, according to some embodiments. In some embodiments, each of the repetitive patterns includes a metal region and a dielectric region. A size of the metal region is not greater than about 25% of a size of the repetitive pattern, according to some embodiments.

In some embodiments, the first bonding layer further includes a first dielectric, and the second bonding layer further includes a second dielectric in contact with the first dielectric at the bonding interface.

According to still another aspect of the present disclosure, a method for forming a semiconductor device is disclosed. A first device layer is formed on a first substrate. A first bonding layer including a first bonding contact and a first bonding alignment mark is formed above the first device layer. A second device layer is formed on a second substrate. A second bonding layer including a second bonding contact and a second bonding alignment mark is formed above the second device layer. The first bonding alignment mark is aligned with the second bonding alignment mark, such that the first bonding contact is aligned with the second bonding contact. The first substrate and the second substrate are bonded in a face-to-face manner, so that the first bonding contact is in contact with the second bonding contact at a bonding interface, and the first bonding alignment mark is in contact with the second bonding alignment mark at the bonding interface.

In some embodiments, a dimension of each of the first and second bonding alignment marks is not greater than about 15 μm. The dimension of each of the first and second bonding alignment marks is about 10 μm, according to some embodiments.

In some embodiments, at least one of the first and second bonding alignment marks includes a plurality of repetitive patterns. A dimension of each of the repetitive patterns is not greater than about 1 μm, according to some embodiments. In some embodiments, each of the repetitive patterns includes a metal region and a dielectric region. A size of the metal region is not greater than about 25% of a size of the repetitive pattern, according to some embodiments.

In some embodiments, a first interconnect layer is formed between the first device layer and the first bonding layer, and a second interconnect layer is formed between the second device layer and the second bonding layer. At least one of the first and second interconnect layers does not include a bonding alignment mark for aligning the first and second bonding contacts.

In some embodiments, the bonding includes hybrid bonding.

According to still another aspect of the present disclosure, a method for determining a degree of alignment of a bonded structure is disclosed. A first bonding layer including a first bonding contact and a first lithography overlay mark is formed. A second bonding layer including a second bonding contact and a second lithography overlay mark is formed. The first bonding layer and the second bonding layer are bonded in a face-to-face manner at a bonding interface. A degree of alignment between the first lithography overlay mark and the second lithography overlay mark is measured. A degree of alignment between the first bonding contact and the second bonding contact is determined based on the measured degree of alignment between the first lithography overlay mark and the second lithography overlay mark.

In some embodiments, the degree of alignment between the first and second lithography overlay marks is measured using infrared light.

In some embodiments, a dimension of each of the first and second lithography overlay marks is not greater than about 15 μm. The dimension of each of the first and second lithography overlay marks is about 10 μm, according to some embodiments.

In some embodiments, at least one of the first and second lithography overlay marks includes a plurality of repetitive patterns. A dimension of each of the repetitive patterns is not greater than about 1 μm, according to some embodiments. In some embodiments, each of the repetitive patterns includes a metal region and a dielectric region. A size of the metal region is not greater than about 25% of a size of the repetitive pattern, according to some embodiments.

In some embodiments, the bonding includes hybrid bonding.

The foregoing description of the specific embodiments will so reveal the general nature of the present disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

Embodiments of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Summary and Abstract sections may set forth one or more but not all exemplary embodiments of the present disclosure as contemplated by the inventor(s), and thus, are not intended to limit the present disclosure and the appended claims in any way.

The breadth and scope of the present disclosure should not be limited by any of the above-described exemplary embodiments, but should be defined only in accordance with the following claims and their equivalents.

What is claimed is:

1. A semiconductor device, comprising:
a first semiconductor structure comprising a substrate, a first device layer disposed on the substrate, and a first bonding layer disposed above the first device layer and comprising a first bonding contact and a first bonding alignment mark;
a second semiconductor structure comprising a second device layer, and a second bonding layer disposed below the second device layer and comprising a second bonding contact and a second bonding alignment mark; and
a bonding interface between the first semiconductor structure and the second semiconductor structure,
wherein the first bonding alignment mark is aligned with the second bonding alignment mark at the bonding interface, such that the first bonding contact is aligned with the second bonding contact at the bonding interface;
a thickness of the first bonding alignment mark is smaller than a thickness of the first bonding contact, and the first bonding alignment mark and the first bonding contact with different thicknesses are in physical contact with a same material;
at least one of the first and second bonding alignment marks comprises a plurality of repetitive patterns, each of the repetitive patterns consisting of a metal region and a dielectric region between two adjacent metal regions; and
a size of the metal region is not greater than about 25% of a size of the respective repetitive pattern.

2. The semiconductor device of claim 1, wherein a dimension of each of the first and second bonding alignment marks is not greater than about 15 μm.

3. The semiconductor device of claim 2, wherein the dimension of each of the first and second bonding alignment marks is about 10 μm.

4. The semiconductor device of claim 1, wherein a dimension of each of the repetitive patterns is not greater than about 1 μm.

5. The semiconductor device of claim 1, wherein
the first semiconductor structure further comprises a first interconnect layer between the first device layer and the first bonding layer;
the second semiconductor structure further comprises a second interconnect layer between the second device layer and the second bonding layer; and
at least one of the first and second interconnect layers does not include a bonding alignment mark for aligning the first and second bonding contacts.

6. The semiconductor device of claim 1, wherein the first bonding layer further comprises a first dielectric, and the second bonding layer further comprises a second dielectric in contact with the first dielectric at the bonding interface.

7. The semiconductor device of claim 1, wherein at least one of the first and second bonding alignment marks is a lithography overlay mark.

8. The semiconductor device of claim 1, wherein one of the first and second device layers comprises a NAND memory string, and another one of the first and second device layers comprises a peripheral device.

9. A bonded structure, comprising:
a first bonding layer comprising a first bonding contact and a first bonding alignment mark;
a second bonding layer comprising a second bonding contact and a second bonding alignment mark; and
a bonding interface between the first bonding layer and the second bonding layer,
wherein the first bonding alignment mark is aligned with the second bonding alignment mark at the bonding interface, such that the first bonding contact is aligned with the second bonding contact at the bonding interface;
a thickness of the first bonding alignment mark is smaller than a thickness of the first bonding contact, and the first bonding alignment mark and the first bonding contact with different thicknesses are in physical contact with a same material;
a dimension of each of the first bonding alignment mark and the second bonding alignment mark is not greater than about 15 μm;
at least one of the first and second bonding alignment marks comprises a plurality of repetitive patterns, each of the repetitive patterns consisting of a metal region and a dielectric region between two adjacent metal regions; and
a size of the metal region is not greater than about 25% of a size of the respective repetitive pattern.

10. The bonded structure of claim 9, wherein the dimension of each of the first and second bonding alignment marks is about 10 μm.

11. The bonded structure of claim 9, wherein a dimension of each of the repetitive patterns is not greater than about 1 μm.

12. The bonded structure of claim 9, wherein the first bonding layer further comprises a first dielectric, and the second bonding layer further comprises a second dielectric in contact with the first dielectric at the bonding interface.

13. A bonded structure, comprising:
a first bonding layer comprising a first bonding contact, a first bonding alignment mark, and a first dielectric;
a second bonding layer comprising a second bonding contact, a second bonding alignment mark, and a second dielectric; and
a bonding interface between the first bonding layer and the second bonding layer,
wherein the first bonding alignment mark is aligned with the second bonding alignment mark at the bonding interface, such that the first bonding contact is aligned with the second bonding contact at the bonding interface;
a thickness of the first bonding alignment mark is smaller than a thickness of the first bonding contact;

the first bonding alignment mark and the first bonding contact with different thicknesses are completely surrounded by the first dielectric;

at least one of the first and second bonding alignment marks comprises a plurality of repetitive patterns, each of the repetitive patterns consisting of a metal region and a dielectric region between two adjacent metal regions; and a size of the metal region is not greater than about 25% of a size of the respective repetitive pattern.

14. The bonded structure of claim 13, wherein a dimension of each of the first bonding alignment mark and the second bonding alignment mark is not greater than about 15 µm.

* * * * *